(12) United States Patent
Yasui et al.

(10) Patent No.: US 11,864,324 B2
(45) Date of Patent: Jan. 2, 2024

(54) MOVING WORK MANAGEMENT DEVICE, MOVING WORK DEVICE, MOUNTING SYSTEM, AND MOVING WORK MANAGEMENT METHOD

(71) Applicant: FUJI CORPORATION, Chiryu (JP)

(72) Inventors: Yoshihiro Yasui, Nagoya (JP); Yukihiro Yamashita, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 287 days.

(21) Appl. No.: 17/266,736

(22) PCT Filed: Aug. 23, 2018

(86) PCT No.: PCT/JP2018/031146
§ 371 (c)(1),
(2) Date: Feb. 8, 2021

(87) PCT Pub. No.: WO2020/039544
PCT Pub. Date: Feb. 27, 2020

(65) Prior Publication Data
US 2021/0315138 A1 Oct. 7, 2021

(51) Int. Cl.
*B23P 19/00* (2006.01)
*H05K 13/02* (2006.01)

(52) U.S. Cl.
CPC .................................. *H05K 13/021* (2013.01)

(58) Field of Classification Search
CPC ... H05K 13/021; H05K 13/085; H05K 13/086
See application file for complete search history.

(56) References Cited

U.S. PATENT DOCUMENTS

| 9,489,730 | B2 * | 11/2016 | Doettling | G06T 7/0004 |
| 9,545,045 | B2 * | 1/2017 | Yamauchi | H05K 13/0061 |
| 11,464,145 | B2 * | 10/2022 | Yasui | H05K 13/086 |
| 2017/0208713 | A1 | 7/2017 | Iisaka et al. | |

FOREIGN PATENT DOCUMENTS

| JP | 2005-216965 A | 8/2005 |
| JP | 2013-51240 A | 3/2013 |
| WO | WO 2017/033268 A1 | 3/2017 |

OTHER PUBLICATIONS

International Search Report dated Oct. 30, 2018 in PCT/JP2018/031146 filed on Aug. 23, 2018, 2 pages

* cited by examiner

*Primary Examiner* — Paul D Kim
(74) *Attorney, Agent, or Firm* — Oblon, McClelland, Maier & Neustadt, L.L.P.

(57) ABSTRACT

The mounting system includes a mounting device, having a mounting loading section from which components can be picked up and a buffer loading section from which components cannot be picked up, and a moving work device for collecting or loading feeders. Further, this mounting system includes a moving work management device configured to create, in the production of a mounting target, pre-arrangement information, based on a production plan including multiple pieces of mounting condition information, which causes the moving work device to load the standby feeder to be used from the next time onward to the buffer loading section in an order corresponding to the arrangement positions of the feeders from the next time onward.

7 Claims, 5 Drawing Sheets

MOVING WORK MANAGEMENT DEVICE, MOVING WORK DEVICE, MOUNTING SYSTEM, AND MOVING WORK MANAGEMENT METHOD

TECHNICAL FIELD

The present specification discloses a moving work management device, a moving work device, a mounting system, and a moving work management method.

BACKGROUND ART

Conventionally, a mounting system has been proposed in which a feeder storage is placed in a production line, and an exchange robot (moving work device) is provided which moves between mounting devices and a feeder storage section and exchanges feeders between the mounting devices and the feeder storage section (see Patent Document 1, for example). In this mounting system, a feeder is exchanged by a moving work device at the time of exchanging the feeder.

PATENT LITERATURE

Patent Document 1: International Publication No. 2017/033268

BRIEF SUMMARY

Technical Problem

However, in the mounting device of Patent Document 1, the feeder can be automatically exchanged, but the time for exchanging has not been considered.

It is a principal object of the present disclosure to provide a moving work management device, a mounting system, and a moving work management method capable of more efficiently exchanging the feeder.

The present disclosure has taken the following means to achieve the main object described above.

The moving work management device of the present disclosure is a moving work management device used in a mounting system comprising a mounting device provided with a mounting section configured to mount a component on a mounting target, a supply section configured to load a feeder, including a holding member for holding a component, to a loading section having a mounting loading section from which the mounting section can pick up the component and a buffer loading section from which the mounting section cannot pick up the component, and a mounting control section configured to cause the mounting section to pick up the component from the feeder; and a moving work device provided with an accommodation section configured to accommodate the feeder and a moving control section, configured to move the feeder, for collecting the feeder from the supply section or loading the feeder to the supply section; wherein the moving work management device is provided with a management control section configured to create pre-arrangement information in which the moving work device loads standby feeders, to be used from the next time onward in producing the mounting target, to the buffer loading section in an order corresponding to the arrangement positions of the feeder from the next time onward based on a production plan including multiple pieces of mounting condition information.

In this moving work management device, in the production of the mounting target, pre-arrangement information is created based on a production plan including multiple pieces of mounting condition information, wherein the moving work device is caused to load the standby feeders to be used from the next time onward to the buffer loading section in an order corresponding to the arrangement positions of the feeders from the next time onward. The moving work device that has acquired the pre-arrangement information then loads the standby feeders to the buffer loading section in the order corresponding to the above-described arrangement positions. In this moving work management device, since the moving work device can exchange the standby feeders by causing the feeders to stand by in the order in which the feeders to be used next will be used without performing detailed positional adjustments, the feeders are more efficiently exchanged. Here, the "buffer loading section" may be disposed below the "mounting loading section".

DESCRIPTION OF EMBODIMENTS

Figure 1:
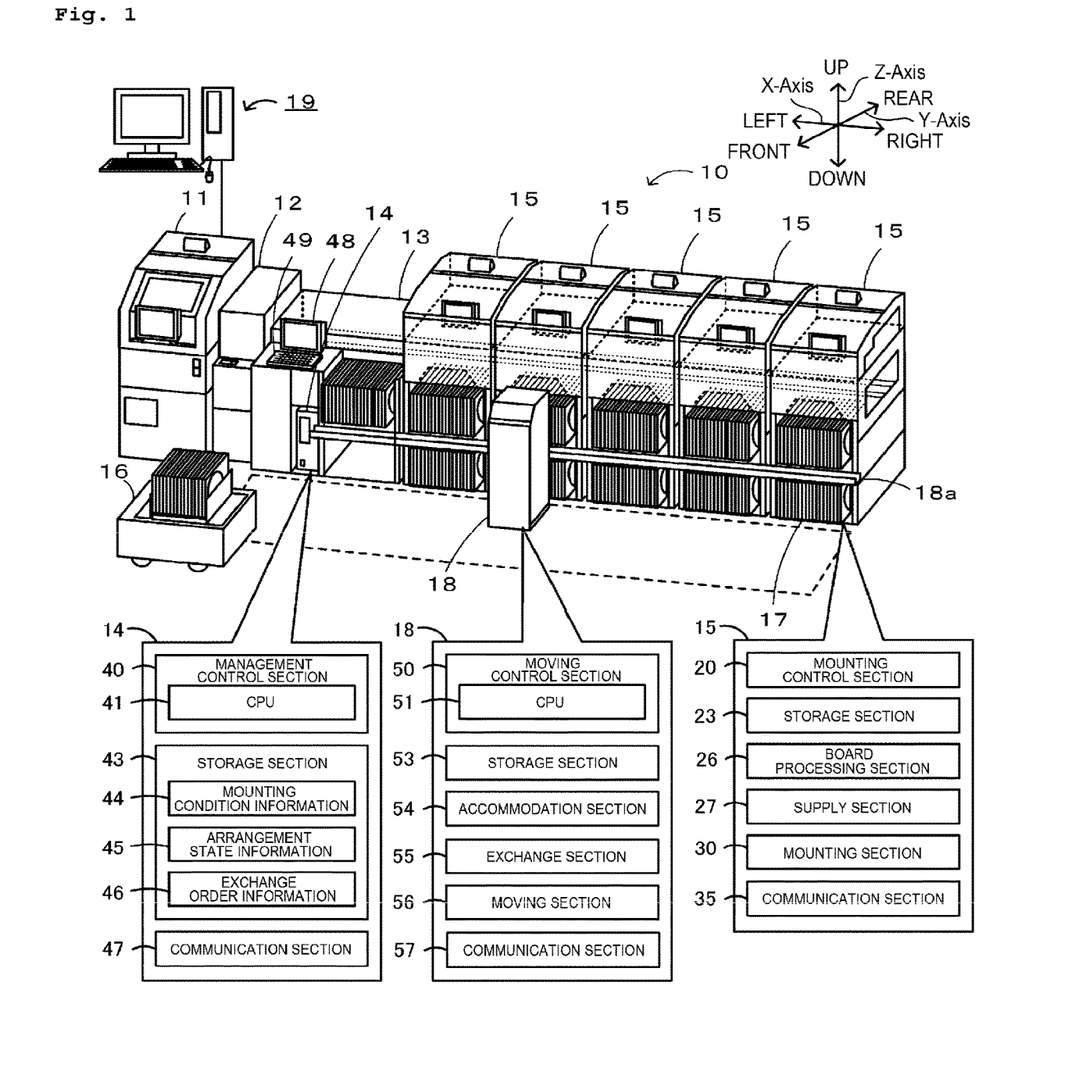
FIG. 1 is a schematic diagram showing an example of mounting system 10.
Figure 2:
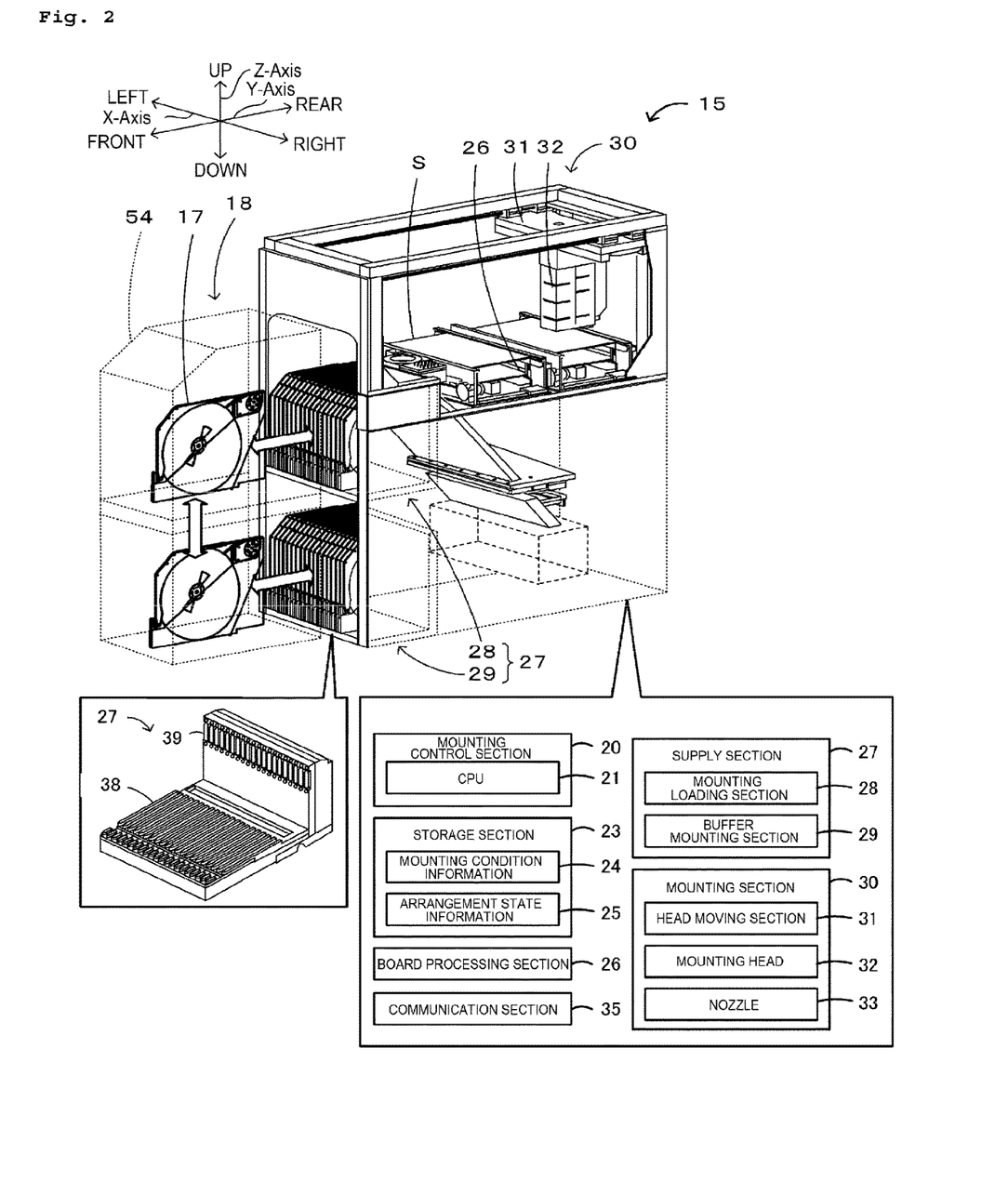
FIG. 2 is a diagram schematically showing a configuration of mounting device 15 and loader 18.
Figure 3:
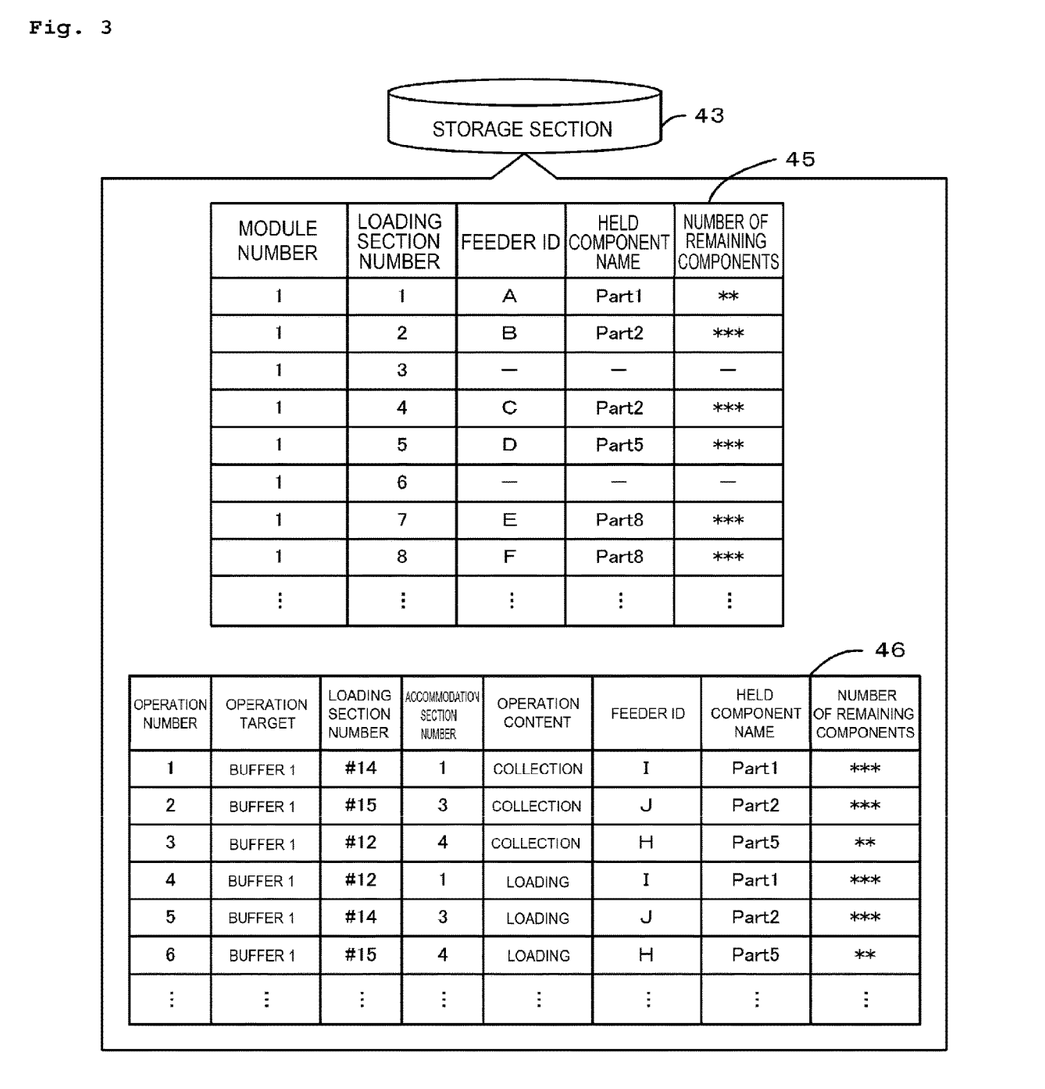
FIG. 3 is a diagram showing an example of information stored in storage section 43.

The present embodiment will be described below with reference to the drawings. FIG. 1 is a schematic diagram showing an example of mounting system 10 of the present disclosure. FIG. 2 is a diagram schematically showing a configuration of mounting device 15 and loader 18 which is a moving work device. FIG. 3 is a diagram showing an example of arrangement state information 45 and pre-arrangement state information 46 stored in storage section 43 of management PC 14. In the present embodiment, the left-right direction (X-axis), the front-rear direction (Y-axis), and the up-down direction (Z-axis) are as shown in FIGS. 1 and 2.

Mounting system 10 is configured, for example, as a production line in which devices are arranged in the conveyance direction of board S, the devices being devices for performing processes to mount components on board S which is a mounting target. Here, the mounting target is described as board S, but the present disclosure is not particularly limited to this as long as the object is an object on which components are mounted and may be a substrate having a three-dimensional shape. As shown in FIG. 1, mounting system 10 includes printing device 11, print inspection device 12, feeder storage section 13, management PC 14, mounting device 15, automatic conveyance vehicle 16, loader 18, host PC 19, and the like. Printing device 11 is a device for printing solder paste or the like on board S. Print inspection device 12 is a device for inspecting the state of the printed solder. Feeder storage section 13 is a storage location for storing feeder 17 used in mounting device 15.

Feeder storage section 13 is provided below the conveyance device between print inspection device 12 and mounting device 15.

Mounting device 15 is a device for picking up components and mounting components on board S. Mounting device 15 includes mounting control section 20, storage section 23, board processing section 26, supply section 27, mounting section 30, and communication section 35. As shown in FIG. 2, mounting control section 20 is configured as a microprocessor centered on CPU 21 and controls the entire device. Mounting control section 20 outputs control signals to board processing section 26, supply section 27, and mounting section 30, and receives signals from board processing section 26, supply section 27, and mounting section 30. Storage section 23 stores mounting condition information 24, arrangement state information 25, and the like. Mounting condition information 24 is a production job and includes information such as information on components, the arrangement order in which components are mounted on board S, arrangement positions, and loading positions of feeders 17 from which components are picked up. Mounting condition information 24 is created by host PC 19 with an order and arrangement in which the mounting efficiency is high, transmitted from host PC 19, and stored in storage section 23. Arrangement state information 25 is the same information as arrangement state information 45 and will be described in detail later. Mounting device 15 acquires mounting condition information 24 from host PC 19 and creates arrangement state information 25 by itself. Communication section 35 is an interface for exchanging information with external devices such as management PC 14 and host PC 19.

Board processing device 26 is a unit for conveying in, transporting, securing and unloading board S at a mounting position. Board processing device 26 has a pair of conveyor belts extending in the left-right direction and spaced apart from each other in the front-rear direction in FIG. 1. Board S is conveyed by the conveyor belts.

Supply section 27 is a unit for supplying components to mounting section 30. Supply section 27 loads feeders 17 to one or more loading sections, each feeder 17 having a reel around which a tape serving as a holding member for holding components is wound. As shown in FIG. 2, supply section 27 has two upper and lower loading sections to which feeder 17 can be loaded in the front direction. The upper stage is mounting loading section 28 from which a component can be extracted by mounting section 30, and the lower stage is buffer loading section 29 from which a component cannot be extracted by mounting section 30. Here, mounting loading section 28 and buffer loading section 29 are collectively referred to as the loading section. The loading sections may be managed in module units grouping a predetermined number (e.g., 4 or 12) of feeders 17. Supply section 27 has multiple slots 38, arranged in the X-direction at predetermined intervals so that rail members of feeders 17 are inserted, and connecting portions 39 into which connectors provided at the distal ends of feeders 17 are inserted. Each feeder 17 includes a controller (not shown). The controller stores information such as tape IDs and component types included in feeder 17 and the remaining number of components. When feeder 17 is connected to connecting portion 39, the controller transmits information of feeder 17 to mounting control section 20.

Mounting section 30 is a unit for picking up components from supply section 27 and arranges the components on board S fixed to board processing section 26. Mounting section 30 includes head moving section 31, mounting head 32, and nozzle 33. Head moving section 31 includes a slider guided by guide rails and moved in the XY-direction, and a motor for driving the slider. Mounting head 32 is configured to pick up one or more components and be moved in the XY-direction by head moving section 31. Mounting head 32 is attached to the slider in a detachable manner. One or more nozzles 33 are attached to the lower face of mounting head 32 in a detachable manner. Nozzle 33 is configured to pick up components by use of negative pressure. Aside from nozzle 33, the pickup member for picking up components may be a mechanical chuck or the like that mechanically holds components.

Management PC 14 is a device for managing feeder 17 and is a moving work management device for generating execution data executed by loader 18. Management PC 14 includes management control section 40, storage section 43, communication section 47, display section 48, and input device 49. Management control section 40 is configured as a microprocessor centered on CPU 41 and controls the entire device. Storage section 43 is a device such as an HDD for storing various data such as a processing program. Communication section 47 is an interface for exchanging information with external devices such as mounting device 15 and host PC 19. Display section 48 is a liquid crystal display for displaying various information. Input device 49 includes a keyboard, a mouse, and the like through which an operator inputs various commands. As shown in FIGS. 1 and 3, storage section 43 stores mounting condition information 44, arrangement state information 45, pre-arrangement state information 46, and the like. Mounting condition information 44 is the same as mounting condition information 24 and is acquired from host PC 19. As shown in FIG. 3, arrangement state information 45 is information including the type and the usage state of feeder 17 (component type, remaining number of components, etc.) that is currently installed in supply section 27 of mounting device 15. Arrangement state information 45 includes the module number of supply section 27, the loading section number indicating the position of the loading section, the ID of feeder 17 loaded to the loading section, the name of the component held by feeder 17, the number of remaining components, and the like. Arrangement state information 45 is appropriately updated with current information when feeder 17 is loaded or unloaded. Pre-arrangement information 46 is information used by loader 18 when performing a pre-arrangement process for pre-loading feeder 17 used for the production of the next board S to an available loading section of supply section 27. It should be noted that feeder 17 used in the next and subsequent mounting processes (production of board S) and loaded to supply section 27 in advance is referred to as standby feeder 17b. Pre-arrangement information 46 includes information such as the exchange number which is the order in which the arrangement positions are changed, the operation target, the loading section number which is the position of the loading section of supply section 27, the number of accommodation section 54 that accommodates standby feeder 17b, the content of collection or loading work, identification information (ID) of standby feeder 17b that is the operation target, the name of the component held by standby feeder 17b, and the number of remaining components thereof. For example, operation number 1 of pre-arrangement information 46 in FIG. 3 defines an operation for collecting feeder I loaded to loading section #14 of the first buffer loading section 29 into the first slot of accommodation section 54.

Automatic conveyance vehicle 16 is configured to automatically convey feeder 17, a member used in mounting system 10, and the like between a storage chamber (not shown) and feeder storage section 13.

Loader 18 is a moving work device and is a device that moves within a moving area at the front face of mounting system 10 (see dashed lines in FIG. 1) and automatically collects and replenishes feeders 17 of mounting device 15. Loader 18 includes moving control section 50, storage section 53, accommodation section 54, exchange section 55, moving section 56, and communication section 57. Moving control section 50 is configured as a microprocessor centered on CPU 51 and controls the entire device. Storage section 53 is an HDD or the like for storing various data such as processing programs and stores arrangement state information 45. Accommodation section 54 has an accommodation space for accommodating feeders 17. Accommodation section 54 is configured to accommodate, for example, four feeders 17. Exchange section 55 is a mechanism for moving feeder 17 in and out as well between the upper and lower levels (see FIG. 2). Exchange section 55 has a clamp for clamping feeder 17, a Y-axis slider for moving the clamp in the Y-axis direction (front-rear direction), and a Z-axis slider for moving the clamp in the Z-axis direction (up-down direction). Exchange section 55 loads and unloads feeder 17 at mounting loading section 28 and loads and unloads feeder 17 at buffer loading section 29. Moving section 56 is a mechanism for moving loader 18 in the X-axis direction (the left-right direction) along X-axis rail 18a disposed on the front face of mounting device 15. Communication section 57 is an interface for exchanging information with external devices such as management PC 14 and mounting device 15. Loader 18 outputs the current position and the contents of the executed operation to management PC 14.

Host PC 19 (see FIG. 1) is configured as a server for managing information of each device in mounting system 10. Host PC 19 includes a control section for controlling the entire device, a storage section for storing various information, and a communication section for performing bidirectional communication with external devices such as mounting system 10, automatic conveyance vehicle 16, and loader 18. Host PC 19 acquires and manages information of mounting system 10 in addition to creating and managing condition information used in the mounting of components.

Figure 4:
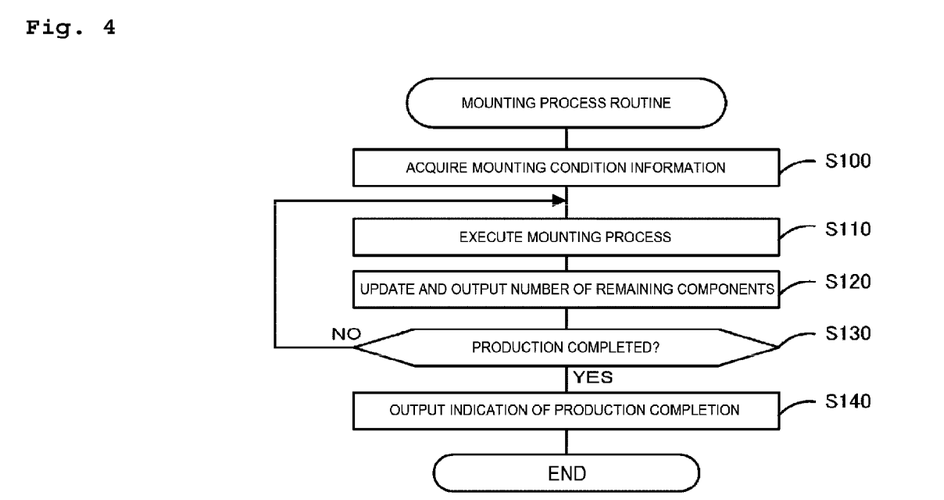
FIG. 4 is a flowchart showing an example of a mounting process routine.

Next, among the operations of mounting system 10 of the present embodiment configured as described above, the process by which mounting device 15 mounts a component on board S will be described first. FIG. 4 is a flowchart showing an example of a mounting process routine executed by CPU 21 included in mounting control section 20 of mounting device 15. This routine is stored in storage section 23 of mounting device 15 and executed in accordance with a start instruction from an operator. When this routine is started, CPU 21 first acquires mounting condition information 24 of board S to be manufactured at this time (S100). CPU 21 acquires the mounting condition information from host PC 19. Next, CPU 21 executes a mounting process based on mounting condition information 24 (S110). In the mounting process, CPU 21 causes mounting head 32 to pick up a component from feeder 17 at a predetermined position based on mounting condition information 24 and moves the component to an arrangement position of board S. Subsequently, CPU 21 updates the number of remaining components of the used component and outputs the updated number to host PC 19 and management PC 14 (S120). CPU 21 determines whether the production of board S is completed (S130). If production is not completed, CPU 21 executes the processes of S110 and subsequent steps. On the other hand, when production is completed in S170, information indicating that production is completed is outputted to host PC 19 or management PC 14 (S140) and terminates this routine. Then, when the production of board S is finished, the position of feeder 17 is changed or replaced as required to execute the mounting process for producing the next board S. At this juncture, loader 18 also performs a process for retracting feeder 17 loaded to mounting loading section 28 to buffer loading section 29.

Figure 5:
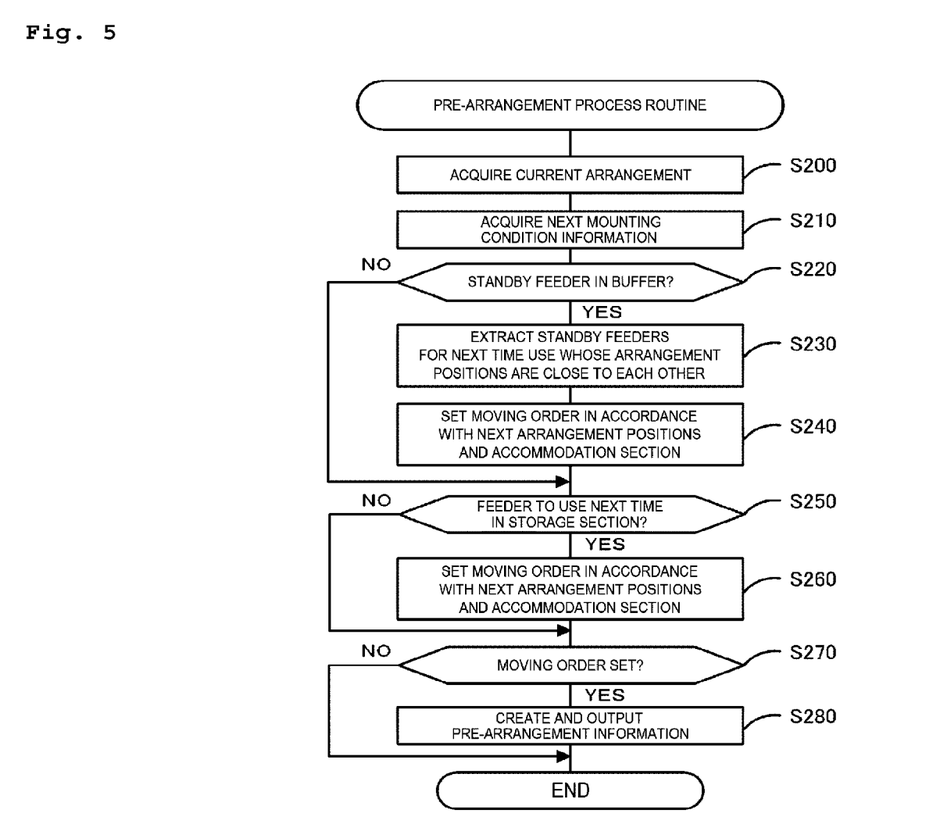
FIG. 5 is a flowchart showing an example of a pre-arrangement process routine.

Next, the process for creating the work contents of loader 18 performed by management PC 14 will be described. Particularly, the process for preparing the next mounting process while executing the mounting process for producing board S will be described. FIG. 5 is a flowchart showing an example of a pre-arrangement process routine executed by CPU 41 included in management control section 40 of management PC 14. This routine is stored in storage section 43 of management PC 14 and is executed before switching from the production of the current board S to the production of the next board S, for example, at the end of the mounting process currently being executed. This routine is preferably initiated, for example, at a timing such that loader 18 can complete the pre-arrangement by the time the next production is started. When this routine is started, CPU 41 first reads arrangement state information 45, acquires the current arrangement of feeders 17 (S200), and acquires mounting condition information 44 to be executed next time from host PC 19 (S210). CPU 41 next determines whether there is standby feeder 17b used in the next mounting process in buffer loading section 29 (S220). When standby feeders 17b to be used in the next mounting process are present in buffer loading section 29, CPU 41 sequentially extracts standby feeders 17b for the next mounting process whose arrangement positions are close to each other (S230).

Subsequently, CPU 41 sets the moving order of standby feeders 17b so that standby feeders 17b are arranged in buffer loading section 29 in accordance with the arrangement positions of feeders 17 used in the next mounting process (S240). At this time, CPU 41 sets the moving order including the accommodation destinations in accommodation section 54. Specifically, CPU 41 sets receiving destinations, rearrangement destinations, accommodation positions of accommodation section 54, and the moving order for standby feeders 17b, which are among feeders 17 currently loaded to buffer loading section 29, so that standby feeders 17b used in the next mounting process become loaded to the lower stage (i.e., buffer loading section 29) of the positions to which standby feeders 17b will load in mounting loading section 28 in the next mounting process. At this juncture, CPU 41 sets the moving order in which standby feeder 17b is loaded to buffer loading section 29 with the upper limit of the number that can be accommodated in accommodation section 54. In addition, CPU 41 may, for example, set the moving order in which the number of standby feeders 17b smaller than the upper limit number that can be accommodated in accommodation section 54 is moved at once in consideration of the moving distance of standby feeder 17b and the like and loaded to buffer loading section 29. For example, standby feeder 17b located at a distance may have better moving efficiency when moved together with another standby feeder 17b that is closer to the receiving destination. It is more preferable to set the moving order of standby feeder 17b in consideration of such a moving efficiency.

After S240 or when there are no standby feeders 17b in S220, CPU 41 determines whether there are feeders 17 used in the next mounting process in feeder storage section 13 (S250). When feeders 17 used in the next mounting process are present in feeder storage section 13, CPU 41 sequentially extracts feeders 17 used in the next mounting process whose arrangement positions are closer to each other, and sets the moving order of feeders 17 in feeder storage section 13 so that feeders 17 in feeder storage section 13 are arranged in accordance with the arrangement positions of feeders 17 used in the next mounting process (S260). At this time, CPU 41 sets the moving order including the accommodation destinations in accommodation section 54. Specifically, CPU 41 sets receiving destinations (loading section numbers), rearrangement destinations (loading section numbers), accommodation positions of accommodation section 54 (accommodation section numbers) and the moving order (operation numbers) of feeder 17 that are currently stored in feeder storage section 13 so that feeders 17 to be used in the next mounting process become loaded to the lower stage (i.e., buffer loading section 29) of the positions to which feeders 17 will load in mounting loading section 28 in the next mounting process. By adding this moving order, feeders 17 not in buffer loading section 29 are loaded to buffer loading section 29 in a state in which the feeders 17 are added from feeder storage section 13. It should be noted that feeders 17 not in buffer loading section 29 and feeder storage section 13 result in available space in buffer loading section 29 and are added to mounting loading section 28 at the time of the next setup change of the mounting process. Feeders 17 not used in the next mounting process may be loaded to available loading sections or may be returned to feeder storage section 13.

After S260 or when there is no feeder to be used in the next mounting process in feeder storage section 13 in S250, CPU 41 determines whether the moving order of feeders 17 to be used in the next mounting process is set (S270), and when the moving order is not set, CPU 41 terminates this routine as it is. On the other hand, when the moving order has been set in S270, CPU 41 creates pre-arrangement information 46 including the moving order, outputs pre-arrangement information 46 to loader 18 (S280) and terminates the routine. Loader 18 having acquired pre-arrangement information 46 executes an operation of moving feeder 17 based on the moving order of the receiving destination, the rearrangement destination, the accommodation position of accommodation section 54 of feeder 17 included in pre-arrangement information 46.

Figure 6A:
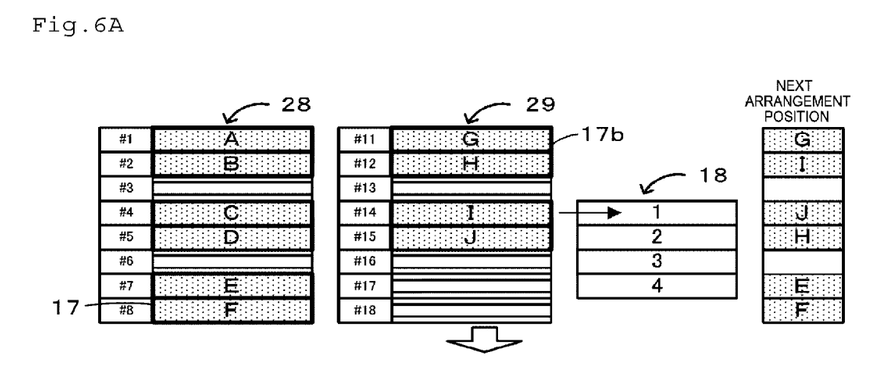
FIG. 6 is a diagram showing an example of a pre-arrangement process for rearranging feeders 17.
Figure 6B:
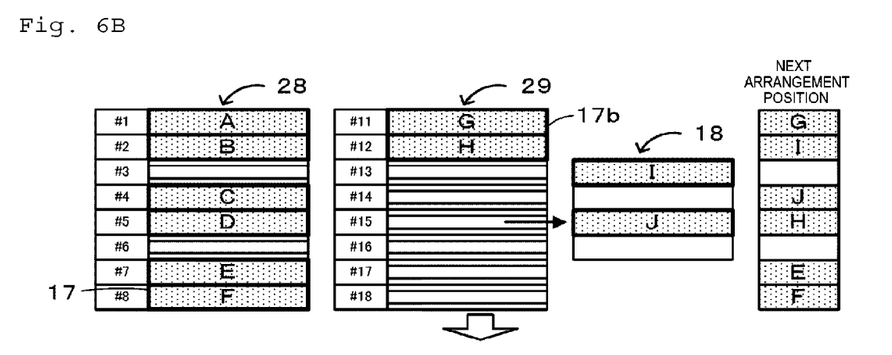
Figure 6C:
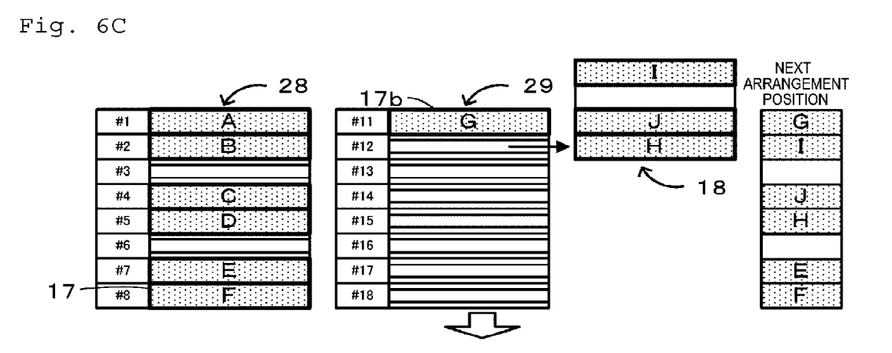
Figure 6D:
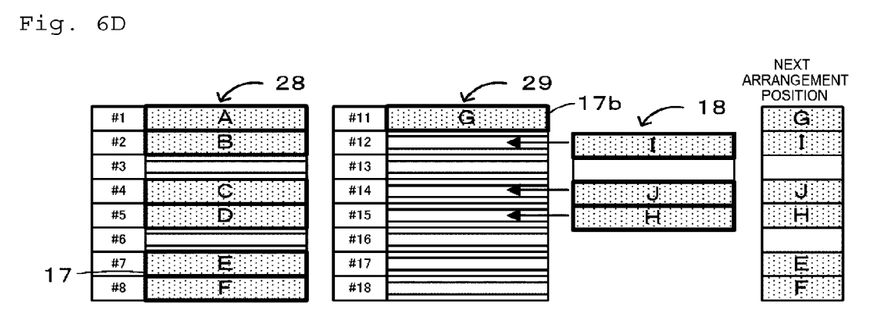

FIG. 6 is a diagram showing an example of a pre-arrangement process for rearranging feeders 17, FIG. 6A shows the start of the process, FIGS. 6B, 6C show the collection of standby feeders 17b to loader 18, and FIG. 6D shows the rearrangement to buffer loading section 29. FIG. 6 shows details of the execution of the pre-arrangement process prescribed in pre-arrangement state information 46 from the current arrangement positions of standby feeders 17b prescribed in arrangement state information 45 shown in FIG. 3. CPU 51 of loader 18 first executes the operations prescribed by operation numbers 1 to 3 based on the content of pre-arrangement information 46. That is, CPU 51 moves to the front of standby feeders 17b disposed in the current buffer loading section 29, collects one or more standby feeders 17b, and accommodates the standby feeders 17b in accommodation section 54. Standby feeders 17b are next moved to and loaded to buffer loading section 29, at the lower stage, at positions where feeders 17 are loaded in the next mounting process (FIG. 6D). CPU 51 moves feeders 17 from feeder storage section 13 and loads the feeders 17 to buffer loading section 29 as required. CPU 51 repeats one exchange of feeders 17 with the number of feeders 17 that can be accommodated in accommodation section 54 as an upper limit and executes the exchange of feeders 17 with respect to the entire buffer loading section 29 of supply section 27. As a result, feeders 17 are disposed in buffer loading section 29 in the order in which feeders 17 are disposed in mounting loading section 28 in the next mounting process (see FIG. 6D). Thereafter, when the current mounting process is finished, loader 18 executes, in the setup change process, a process for removing feeders 17 loaded to mounting loading section 28 that are not used for the next mounting process and moving standby feeders 17b disposed in buffer loading section 29 to mounting loading section 28. In loader 18, since the exchange between mounting loading section 28 and buffer loading section 29 in the upper and lower stages can be performed without moving the main body (see FIG. 2), multiple feeders 17 can be moved in parallel.

Here, the correspondence between the constituent elements of the present embodiment and the constituent elements of the present disclosure will be specified. Mounting device 15 of the present embodiment corresponds to a mounting device, management PC 14 corresponds to a moving work management device, and loader 18 corresponds to a moving work device. In addition, supply section 27 corresponds to a supply section, mounting section 28 and buffer mounting section 29 correspond to a mounting section, mounting section 30 corresponds to a mounting section, and mounting control section 20 corresponds to a mounting control section. In addition, accommodation section 54 corresponds to an accommodation section, and moving control section 50 corresponds to a moving control section. In addition, mounting condition information 44 corresponds to mounting condition information, standby feeder 17b corresponds to a standby feeder, pre-arrangement information 46 corresponds to pre-arrangement information, and management control section 40 corresponds to a management control section. In addition, feeder storage section 13 corresponds to a storage section, the tape corresponds to a holding member, and board S corresponds to a mounting target.

In mounting system 10 described above, in management PC 14, in the production of board S, pre-arrangement information 46 is created, based on the production plan including mounting condition information 44, wherein loader 18 is caused to load standby feeders 17b to be used from the next time onward to buffer loading section 29 in an order corresponding to the arrangement positions of feeders 17 from the next time onward. Then, loader 18 having acquired pre-arrangement information 46 causes standby feeder 17b to be loaded to buffer loading section 29 in an order corresponding to the arrangement position. According to the setting of management PC 14, in mounting device 15, feeders 17 used in the next mounting process stand by for buffer loading section 29 in the order used in the next mounting process. In management PC 14, since loader 18 can exchange standby feeders 17b without performing detailed positional adjustment by way of pre-arranging, feeders 17, for example, can be exchanged more efficiently in the setup change. In addition, management control section 40 releases standby feeder 17b from being loaded to buffer loading section 29 and accommodates standby feeder 17b in accommodation section 54, and creates pre-arrangement information 46 for rearranging in accordance with the arrangement positions of feeders 17 for the next time onward. In management PC 14, standby feeders 17b loaded to buffer loading section 29 are rearranged to the arrangement to be used next so that loader 18 can more efficiently exchange feeders 17 thereafter.

Further, management control section 40 creates pre-arrangement information 46 further including an operation of causing loader 18 to load feeders 17 received from feeder storage section 13 to buffer loading section 29 in an order corresponding to the arrangement positions of feeders 17 for the next time onward. In management PC 14, by rearranging feeders 17 to the arrangement to be used next when feeders 17 to be loaded to buffer loading section 29 are loaded to buffer loading section 29, loader 18 can efficiently exchange feeders thereafter. Furthermore, management control section 40 creates pre-arrangement information 46 before switching from the production of the current board S to the production of the next board S. In management PC 14, feeders 17 can be more efficiently exchanged, in particular, since standby feeders 17b are rearranged before switching to the next production. It should be noted that pre-arrangement information 46 may be created before switching to the production of the next board S after the arrangement of feeders 17 for the production of the current board S is created.

It is obvious that the present disclosure is not limited to the above-described embodiments and can be implemented in various modes as long as the modes belong to the technical scope of the present disclosure.

For example, in the embodiment described above, pre-arrangement information 46 including the moving order in which standby feeders 17b loaded to buffer loading section 29 are rearranged to match the order for next time and the moving order in which feeders 17 stored in feeder storage section 13 are matched with the order for next time and loaded to buffer loading section 29 in the next time and in the combination has been described, but the present disclosure is not particularly limited thereto, and pre-arrangement information 46 may be created for only rearranging standby feeders 17b loaded to buffer loading section 29 or only loading feeders 17 stored in feeder storage section 13 to buffer loading section 29. Also in this mounting system 10, feeders 17 are exchanged more efficiently since at least a part of the arrangement of feeders 17 to be used in the next mounting process is present in buffer loading section 29.

In the above embodiment, pre-arrangement information 46 is created before switching from the production of the current board S to the production of the next board S, but the present disclosure is not particularly limited to this as long as it is before switching to the next production, and, for example, in a production plan for producing three or more boards S, pre-arrangement information 46 for the production of the second and subsequent boards S may be created at the time of the first production. It should be noted that since the loading state of feeders 17 or the like change from moment to moment, it is desirable to create pre-arrangement information 46 at a timing close to the next production.

In the above embodiment, mounting system 10 includes printing device 11, print inspection device 12, feeder storage 13, management PC 14, and mounting device 15, but the present disclosure is not particularly limited thereto, and one or more of the above devices may be omitted or other devices may be added.

In the above embodiment, management PC 14 installed in feeder storage section 13 has been described as managing loader 18, but the present disclosure is not particularly limited to this and may be provided with this function in other devices such as host PC 19, mounting device 15, and loader 18, for example. In the above embodiment, loader 18 is configured to load or collect feeder 17, but the present disclosure is not particularly limited thereto, and may be configured so that automatic conveyance vehicle 16 loads and collects feeder 17.

In the above embodiment, the present disclosure is applied to a mode of mounting system 10, but the present disclosure may be applied to management PC 14 (moving work management device) or loader 18 (moving work device), or may be applied to the management method of moving work.

The moving work management device, the moving work device, the mounting system, and the moving work management method of the present disclosure may be configured as follows. For example, in the moving work management device of the present disclosure, the management control section may unload the standby feeders loaded to the buffer loading section, accommodate the feeders in the accommodation section, and create the pre-arrangement information to be sorted in accordance with the arrangement positions of the feeders for the next time onward. In this moving work management device, by rearranging the standby feeders loaded to the buffer loading section in advance to the arrangement to be used next, the moving work device can thereafter exchange feeders more efficiently.

In the moving work management device of the present disclosure, the mounting system has a storage section, different from the buffer loading section, configured to store the feeder, and the management control section creates pre-arrangement information in which the moving work device loads the feeders received from the storage section to the buffer loading section in the order of the arrangement positions of the feeders from the next time onward. In this moving work management device, by rearranging the standby feeders to the arrangement to be used next when standby feeders to be loaded to the buffer loading section are loaded to the buffer loading section, the moving work device can thereafter exchange feeders more efficiently. In addition, the management control section may create pre-arrangement information in which standby feeders, including standby feeders loaded to the buffer loading section and standby feeders stored in the storage section, are caused to load to the buffer loading section in an order corresponding to the arrangement positions of feeders from the next time onward.

The moving work management device of the present disclosure, the management control section may create the pre-arrangement information before switching from the production of the current mounting target to the production of the next mounting target. In this moving work management device, feeders are more efficiently exchanged since the standby feeders are rearranged before switching to the next production. The moving work management device of the present disclosure, the management control section may create the pre-arrangement information before switching to the production of the next mounting target after creating the arrangement of the feeders for the production of the current mounting target.

In the moving work management device of the present disclosure, the accommodation section may be configured to accommodate a predetermined number of one or more of the feeders, and the management control section may create the pre-arrangement information in which the standby feeders are caused to load to the buffer loading section with the predetermined number as an upper limit. In consideration of the moving distance of the standby feeder and the like, the management control section may, for example, create pre-arrangement information in which a number of standby feeders smaller than a predetermined number that can be accommodated in the accommodation section is loaded to the buffer loading section at once.

The moving work device of the present disclosure is a moving work device used in a mounting system comprising a mounting device provided with a mounting section configured to mount a component on a mounting target, a supply section configured to load a feeder, including a holding member for holding the component, to a loading section having a mounting loading section from which the mounting section can pick up the component and a buffer loading section from which the mounting section cannot pick up the component, and a mounting control section configured to cause the mounting section to pick up the component from the feeder; and a moving work management device provided with a moving work device configured to move the feeder to be collected from the supply section or be loaded to the supply section and a management control section configured to create information used by the moving work device; wherein the moving work device is provided with an accommodation section configured to accommodate the feeder and a moving control section configured to load the standby feeders, to be used from the next time onward in the production of the mounting target, to the buffer loading section in an order corresponding to the arrangement positions of the feeder from the next time onward based on a production plan including multiple pieces of mounting condition information.

In this moving work device, similarly to the above-described moving work management device, since the moving work device can exchange the standby feeders by causing the feeders to stand by in the order in which the feeders to be used next will be used without performing detailed positional adjustments, the feeders are more efficiently exchanged. In this moving work device, various modes of the above-described moving work management device may be employed or processes for achieving each function of the above-described moving work management device may be added.

The mounting system of the present disclosure includes a mounting device provided with a mounting section configured to mount a component on a mounting target, a supply section configured to load a feeder, including a holding member that holds components, to a loading section having a mounting loading section from which the mounting section can pick up the component and a buffer loading section from which the mounting section cannot pick up the component, and a mounting control section configured to cause the mounting section to collect the component from the feeder; a moving work device provided with an accommodation section configured to accommodate the feeder and a moving control section, configured to move the feeder, for collecting the feeder from the supply section or loading the feeder to the supply section; and the moving work management devices according to any of the above descriptions.

In this mounting system, similarly to the above-described moving work management device, since the moving work device can exchange the standby feeders by causing the feeders to stand by in the order in which the feeders to be used next will be used without performing detailed positional adjustments, the feeders are more efficiently exchanged.

The moving work management method of the present disclosure is a moving work management method used in a mounting system comprising a mounting device provided with a mounting section configured to mount a component on a mounting target, a supply section configured to load a feeder, including a holding member that holds components, to a loading section having a mounting loading section from which the mounting section can pick up the component and a buffer loading section from which the mounting section cannot pick up the component, and a mounting control section configured to cause the mounting section to collect the component from the feeder; and a moving work device provided with an accommodation section configured to accommodate the feeder and a moving control section, configured to move the feeder, for collecting the feeder from the supply section or loading the feeder to the supply section; wherein the moving work management device comprising a step for creating pre-arrangement information for loading a standby feeder, to be used from the next time onward in the production of the mounting target, to the buffer loading section with the moving work device based on a production plan including multiple pieces of mounting condition information, the buffer loading section being arranged in accordance with the position of the feeder from the next time onward.

In this moving work management method, similarly to the moving work management device described above, since the moving work device can exchange the standby feeders by causing the feeders to stand by in the order in which the feeders to be used next will be used without performing detailed positional adjustments, the feeders are more efficiently exchanged. It should be noted that in this moving work device, various modes of the above-described moving work management device may be employed or steps for achieving each function of the above-described moving work management device may be added.

In the moving work management device of the present disclosure, the management control section may unload the standby feeders loaded to the buffer loading section, accommodate the feeders in the accommodation section, and create the pre-arrangement information to be sorted in accordance with the arrangement positions of the feeders for the next time onward. In this moving work management device, by rearranging the standby feeders loaded to the buffer loading section in advance to the arrangement to be used next, the moving work device can thereafter exchange feeders more efficiently.

In the moving work management device of the present disclosure, the mounting system has a storage section, different from the buffer loading section, configured to store the feeder, and the management control section creates pre-arrangement information in which the moving work device loads the feeders received from the storage section to the buffer loading section in the order of the arrangement positions of the feeders from the next time onward. In this moving work management device, by rearranging the standby feeders to the arrangement to be used next when standby feeders to be loaded to the buffer loading section are loaded to the buffer loading section, the moving work device can thereafter exchange feeders more efficiently. In addition, the management control section may create pre-arrangement information in which standby feeders, including standby feeders loaded to the buffer loading section and standby feeders stored in the storage section, are caused to load to the buffer loading section in an order corresponding to the arrangement positions of feeders from the next time onward.

The moving work management device of the present disclosure, the management control section may create the pre-arrangement information before switching from the production of the current mounting target to the production of the next mounting target. In this moving work management device, feeders are more efficiently exchanged since the standby feeders are rearranged before switching to the next production. The moving work management device of the present disclosure, the management control section may create the pre-arrangement information before switching to the production of the next mounting target after creating the arrangement of the feeders for the production of the current mounting target.

In the moving work management device of the present disclosure, the accommodation section may be configured to accommodate a predetermined number of one or more of the feeders, and the management control section may create the pre-arrangement information in which the standby feeders are caused to load to the buffer loading section with the predetermined number as an upper limit. In consideration of the moving distance of the standby feeder and the like, the management control section may, for example, create pre-arrangement information in which a number of standby feeders smaller than a predetermined number that can be accommodated in the accommodation section is loaded to the buffer loading section at once.

The moving work device of the present disclosure is a moving work device used in a mounting system comprising a mounting device provided with a mounting section configured to mount a component on a mounting target, a supply section configured to load a feeder, including a holding member for holding the component, to a loading section having a mounting loading section from which the mounting section can pick up the component and a buffer loading section from which the mounting section cannot pick up the component, and a mounting control section configured to cause the mounting section to pick up the component from the feeder; and a moving work management device provided with a moving work device configured to move the feeder to be collected from the supply section or be loaded to the supply section and a management control section configured to create information used by the moving work device; wherein the moving work device is provided with an accommodation section configured to accommodate the feeder and a moving control section configured to load the standby feeders, to be used from the next time onward in the production of the mounting target, to the buffer loading section in an order corresponding to the arrangement positions of the feeder from the next time onward based on a production plan including multiple pieces of mounting condition information.

In this moving work device, similarly to the above-described moving work management device, since the moving work device can exchange the standby feeders by causing the feeders to stand by in the order in which the feeders to be used next will be used without performing detailed positional adjustments, the feeders are more efficiently exchanged. In this moving work device, various modes of the above-described moving work management device may be employed or processes for achieving each function of the above-described moving work management device may be added.

The mounting system of the present disclosure includes a mounting device provided with a mounting section configured to mount a component on a mounting target, a supply section configured to load a feeder, including a holding member that holds components, to a loading section having a mounting loading section from which the mounting section can pick up the component and a buffer loading section from which the mounting section cannot pick up the component, and a mounting control section configured to cause the mounting section to collect the component from the feeder; a moving work device provided with an accommodation section configured to accommodate the feeder and a moving control section, configured to move the feeder, for collecting the feeder from the supply section or loading the feeder to the supply section; and the moving work management devices according to any of the above descriptions.

In this mounting system, similarly to the above-described moving work management device, since the moving work device can exchange the standby feeders by causing the feeders to stand by in the order in which the feeders to be used next will be used without performing detailed positional adjustments, the feeders are more efficiently exchanged.

The moving work management method of the present disclosure is a moving work management method used in a mounting system comprising a mounting device provided with a mounting section configured to mount a component on a mounting target, a supply section configured to load a feeder, including a holding member that holds components, to a loading section having a mounting loading section from which the mounting section can pick up the component and a buffer loading section from which the mounting section cannot pick up the component, and a mounting control section configured to cause the mounting section to collect the component from the feeder; and a moving work device provided with an accommodation section configured to accommodate the feeder and a moving control section, configured to move the feeder, for collecting the feeder from the supply section or loading the feeder to the supply section; wherein the moving work management device comprising a step for creating pre-arrangement information for loading a standby feeder, to be used from the next time onward in the production of the mounting target, to the buffer loading section with the moving work device based on a production plan including multiple pieces of mounting condition information, the buffer loading section being arranged in accordance with the position of the feeder from the next time onward.

In this moving work management method, similarly to the moving work management device described above, since the moving work device can exchange the standby feeders by causing the feeders to stand by in the order in which the feeders to be used next will be used without performing detailed positional adjustments, the feeders are more efficiently exchanged. It should be noted that in this moving work device, various modes of the above-described moving work management device may be employed or steps for achieving each function of the above-described moving work management device may be added.

INDUSTRIAL APPLICABILITY

The present disclosure is applicable to the technological field of devices for picking up and mounting components.

REFERENCE SIGNS LIST

10 Mounting system, 11 Printing device, 12 Print inspection device, 13 Feeder storage section, 14 Management PC, 15 Mounting device, 16 Automatic conveyance vehicle, 17 Feeder, 17b Standby feeder, 18 Loader, 18a X-axis rail, 19 Host PC, 20 Mounting control section, 21 CPU, 23 Storage section, 24 Mounting condition information, 25 Arrangement state information, 26 Board processing section, 27 Supply section, 28 Mounting loading section, 29 Buffer loading section, 30 Mounting section, 31 Head moving section, 32 Mounting head, 33 Nozzle, 35 Communication section, 38 Slot, 39 Connecting section, 40 Management control section, 41 CPU, 43 Storage section, 44 Mounting condition information, 45 Arrangement state information, 46 Pre-arrangement state information, 47 Communication section, 48 Display section, 49 Input device, 50 Moving control section, 51 CPU, 53 Storage section, 54 Accommodation section, 55 Exchange section, 56 Moving section, 57 Communication section, S board

The invention claimed is:

1. A moving work management device used in a mounting system, comprising:
    a mounting device provided with a mounting section configured to mount a component on a mounting target;
    a supply section configured to load a feeder, that holds a component, to a loading section having a mounting loading section from which the mounting section can pick up the component and a buffer loading section from which the mounting section cannot pick up the component;
    a mounting control section configured to cause the mounting section to pick up the component from the feeder; and
    a loader provided with an accommodation section configured to accommodate the feeder and a moving control section, configured to move the feeder, for collecting the feeder from the supply section or loading the feeder to the supply section,
    wherein the moving work management device is provided with a management control section configured to create pre-arrangement information in which the loader loads standby feeders, to be used from a next time onward in a production of the mounting target, to the buffer loading section based on a production plan including multiple pieces of mounting condition information, the buffer loading section being arranged in accordance with arrangement positions of the feeders from the next time onward.

2. The moving work management device of claim 1, wherein the management control section releases the standby feeders from being loaded to the buffer loading section and accommodates the standby feeders in the accommodation section, and creates the pre-arrangement information for rearranging in accordance with the arrangement positions of the feeders for the next time onward.

3. The moving work management device of claim 1,
    wherein the mounting system has a storage section, different from the buffer loading section, configured to store the feeder; and
    the management control section creates pre-arrangement information in which wherein the loader loads the feeders received from the storage section to the buffer loading section in an order of the arrangement positions of the feeders from the next time onward.

4. The moving work management device of claim 1, wherein the management control section creates the pre-arrangement information before switching from the production of a current mounting target to the production of a next mounting target.

5. The moving work management device of claim 1,
    wherein the accommodation section is configured to accommodate a predetermined number of one or more of the feeders, and
    the management control section creates the pre-arrangement information in which the standby feeders are caused to load to the buffer loading section with the predetermined number as an upper limit.

6. A mounting system comprising:
    a mounting device provided with a mounting section configured to mount a component on a mounting target, a supply section configured to load a feeder, that holds the component, to a loading section having a mounting loading section from which the mounting section can pick up the component and a buffer loading section from which the mounting section cannot pick up the component, and a mounting control section configured to cause the mounting section to pick up the component from the feeder;
    a loader provided with an accommodation section configured to accommodate the feeder and a moving control section, configured to move the feeder, for collecting the feeder from the supply section or loading the feeder to the supply section; and
    the moving work management device of claim 1.

7. A moving work management method used in a mounting system comprising
    a mounting device provided with a mounting section configured to mount a component on a mounting target, a supply section configured to load a feeder, that holds the component, to a loading section having a mounting loading section from which the mounting section can pick up the component and a buffer loading section from which the mounting section cannot pick up the component, and a mounting control section configured to cause the mounting section to pick up the component from the feeder; and
    a loader provided with an accommodation section configured to accommodate the feeder and a moving control section, configured to move the feeder, for collecting the feeder from the supply section or loading the feeder to the supply section,
    the moving work management method comprising a step for creating pre-arrangement information for loading standby feeders, to be used from a next time onward in a production of the mounting target, to be used from the next time onward in the production of the mounting target, to the buffer loading section in an order corresponding to the arrangement positions of the feeder from the next time onward based on a production plan including multiple pieces of mounting condition information.

* * * * *